(12) United States Patent
O'Donnell

(10) Patent No.: US 8,026,599 B2
(45) Date of Patent: Sep. 27, 2011

(54) METHOD OF PROTECTING INTEGRATED CIRCUITS

(75) Inventor: Alan O'Donnell, Castletroy (IE)

(73) Assignee: Analog Devices, Inc., Norwood, MA (US)

( * ) Notice: Subject to any disclaimer, the term of this patent is extended or adjusted under 35 U.S.C. 154(b) by 148 days.

(21) Appl. No.: 11/517,131

(22) Filed: Sep. 7, 2006

(65) Prior Publication Data

US 2008/0064137 A1 Mar. 13, 2008

(51) Int. Cl.
*H01L 23/48* (2006.01)
*H01L 23/52* (2006.01)
*H01L 29/40* (2006.01)

(52) U.S. Cl. ........ 257/734; 257/778; 257/787; 257/678; 257/E23.002

(58) Field of Classification Search .............. 438/110, 438/116, 106, 113, 126, 127; 257/E23.001, 257/E21.499, E33.056, 666, 678, 687, 701, 257/729, 734, 777, 778, 787
See application file for complete search history.

(56) References Cited

U.S. PATENT DOCUMENTS

| | | | |
|---|---|---|---|
| 5,449,741 A | 9/1995 | Ando et al. | |
| 5,863,813 A * | 1/1999 | Dando | 438/114 |
| 6,191,884 B1 * | 2/2001 | Takizawa et al. | 359/359 |
| 6,232,428 B1 | 5/2001 | Deets et al. | |
| 6,316,589 B1 | 11/2001 | You et al. | |
| 6,455,920 B2 * | 9/2002 | Fukasawa et al. | 257/620 |
| 6,580,152 B2 * | 6/2003 | Hasegawa | 257/618 |
| 6,908,784 B1 * | 6/2005 | Farnworth et al. | 438/106 |
| 7,015,576 B2 * | 3/2006 | Yamane | 257/704 |
| 2005/0042805 A1 * | 2/2005 | Swenson et al. | 438/113 |
| 2008/0029847 A1 | 2/2008 | Guillermo et al. | |

OTHER PUBLICATIONS

LM3200 Application Datasheet, 2004, National Semiconductor, pp. 14.*
Wolf et al., "Silicon Processing for the VLSI Era: Vol. 1 Process Technology" 2000, Lattice Press, pp. 585-586.*
Larsson et al. "Improved polymer-glass adhesion through micromechanical interlocking", May 10, 2006, J. Micromech. Microeng. 16, pp. S161-S168.*

* cited by examiner

*Primary Examiner* — Alexander Ghyka
*Assistant Examiner* — Leonard Chang
(74) *Attorney, Agent, or Firm* — Knobbe, Martens, Olson & Bear LLP

(57) ABSTRACT

The present application relates to the manufacture of Wafer Level Chip Scale Packages (WLCSPs), which are a type of CSP in which the traditional wire bonding arrangements are dispensed with in favor of making direct contact by means of conductive bumps (typically solder balls) to the integrated circuitry. WLCSPs differ from fine pitch Ball Grid Array (BGA) and leadframe based Chip Scale Packages (CSPs) in that most of the packaging process steps are performed at wafer level. A package and method of manufacture are provided which prevent the ingress of light to the internal circuitry of WLCSP packages by providing a substantially opaque coating on the inactive side of the WLCSP packages and at least partially on the sides of WLCSP packages.

25 Claims, 7 Drawing Sheets

METHOD OF PROTECTING INTEGRATED CIRCUITS

FIELD OF THE APPLICATION

The present application relates to integrated circuit manufacture, to methods of protecting the circuitry contained therein and to devices produced thereby.

BACKGROUND

With an increasing demand for smaller outline consumer electronic products, electronics manufacturers are in turn seeking to minimize the size of components. An example of this is the move from plated through hole components to surface mount components in circuit board assembly.

Integrated circuit manufacturers are not immune from these demands with pitch sizes continually decreasing. A result of this is the introduction of Chip Scale Packages (CSPs). Chip scale packages are generally considered to be packages where the overall footprint (board area occupied) of the package is within 30% of the actual chip size. Wafer Level Chip Scale Packages (WLCSPs) are a type of CSP in which the traditional wire bonding arrangements are dispensed with in favor of making direct contact by means of conductive bumps (typically solder balls) to the integrated circuitry. WLCSPs differ from fine pitch Ball Grid Array (BGA) and leadframe based Chip Scale Packages (CSPs) in that most of the packaging process steps are performed at wafer level.

The smaller form factor package size of WLCSP and their ability to be used with conventional surface mount assembly and reflow techniques makes them a popular choice where minimum board area/weight and package height are key requirements.

As such, WLCSP is gaining rapid acceptance as the package of choice for Radio Frequency (RF)/Analog, Power Management and other devices used in handheld and portable products where size is critical.

One problem with WLCSP parts is that they have exposed bare silicon that has been thinned (in that the typical WLCSP "package" thickness is significantly less than that of a typical fully encapsulated part) which (if mishandled or exposed to a non-optimized board assembly process) may be more susceptible to mechanical damage than a fully encapsulated part.

Whilst, there is a general requirement to reduce the space occupied by packaged integrated circuits in parallel with the general reduction in size\compactness of handheld electronic products, there is still a need to maintain reliability. The present application is directed at improving reliability with reduced package sizes.

SUMMARY

In particular, the applicants have identified that the reduction in wafer thickness and the reduced use or indeed absence of encapsulant means the effects of light upon the integrated circuits operation become significant. Certain integrated circuits are sensitive to light. Given that WLCSP's have exposed bare silicon after assembly onto a printed circuit board this is undesirable for light sensitive parts. The fact that the typical WLCSP manufacturing process utilizes a silicon thinning/back grinding step (to reduce the height occupied by the final device—which is a key consideration for many hand held consumer goods) means that this packaging technology is particularly in need of protection from light where required. The application described here details/outlines how the use of a light resistant material can protect an integrated circuit from the passage of light that may have a detrimental effect on the effective operation of the part.

Because WLCSP parts typically expose bare silicon, they are more susceptible to mechanical damage. Anything that increases the robustness of a WLCSP—such as the addition/application of a protective layer—is highly desirable. This invention provides a light resistant barrier that is also capable of providing mechanical protection to the integrated circuit.

The present application provides a WLCSP having protection from the effects of light. In particular, a first embodiment provides a WLCSP having at least one circuit, the WLCSP comprising an active face providing contacts to the at least one circuit, a non-active face opposing the active face, a plurality of sides between the active face and the non-active face, a connector arrangement provided on the active face for making external connections to the contacts on the active face, and a substantially opaque coating provided on the non-active face and at least partially on the plurality of sides to prevent the ingress of light to the at least one circuit.

A second embodiment provides a method of manufacturing a WLCSP comprising the steps of: providing a wafer with a plurality of integrated circuits fabricated thereon, the wafer having an active face on which connections to the integrated circuits are to be provided and an opposite non-active face, partially sawing through the wafer to define a series of grooves, the grooves outlining the boundary of the individual circuits of the plurality of integrated circuits, providing a layer of substantially opaque material to fill the grooves and cover the non-active face and singulating the integrated circuit. As these grooves extend only partially through the wafer, and not all of the way from the non-active face to the active face, we refer to them as "blind" grooves to distinguish from a cut made completely from one face to the other.

In another embodiment, a Wafer Level Chip Scale Package is provided (WLCSP) having at least one circuit provided internally therein, the WLCSP comprises an active face providing contacts to the at least one circuit, a non-active face opposing the active face, a plurality of sides between the active face and the non-active face,
a first layer covering the non-active face and a second layer partially covering the plurality of sides, whereby the first and second layers protect the at least one circuit. The first and\or second layers are suitably light resistant. The first and\or second layers may be substantially opaque. The first and second light resistant layer may be the same. A device marking may be provided on the first layer. Alternatively, the light resistant first layer may allow certain wavelengths of light to pass through and the device marking may be provided on the inactive surface under the light resistant first layer. Suitably, the light resistant first layer is substantially opaque to infra red light yet substantially transparent to blue light.
The thickness of the second layer may be of suitable thickness to extend partially over the at least one circuit. A connector arrangement may be provided on the active face for making external connections to the contacts on the active face. To improve the adherence of the second layer to the inactive surface, adherence features may be defined in the inactive surface.

A further embodiment provides a method of manufacturing a WLCSP comprising the steps of providing a wafer with a plurality of integrated circuits fabricated thereon, the wafer having an active face on which connections to the integrated circuits are to be provided and an opposite non-active face, partially cutting through the wafer on the inactive face to define a series of grooves, the grooves being along the boundaries between individual circuits of the plurality of integrated circuits, providing a first layer of material to fill the grooves, and providing a second layer of material to cover the non-active face. A further step may be provide to singulate the integrated circuit. A foil or film may be provided under to the active face to support the wafer during the step of partially cutting. When the first and second layers are applied as a liquid, the film or foil acts as a barrier preventing the liquid reaching the active face. Alternatively, a standoff is provided to maintain a gap between the active face and the film or foil and the first and second layers are provided as a liquid and the liquid is allowed to fill the gap between the active face and the film or foil. A further step of providing a bumped connection structure for each of the integrated circuits on the active side of the wafer before singulation the integrated circuits from the wafer may be included. Suitably, the width of the singulating cut is less than the width of the grooves as this allows part of the internal circuitry on the wafer to be located under the grooves. Suitably, the first and second layers are substantially opaque. The first and second layers are provided as a foil or film. Heat and/or pressure may be employed to deform the foil or film causing it to fill the grooves. Advantageously, the substantially opaque material is opaque to certain wavelengths of light and transparent to others as this allows the marking the inactive side of the wafer prior to the step of providing the layer of substantially opaque material. Alternatively or in combination, the inactive side of the wafer may be marked after the step of providing the layer of substantially opaque material. Adherence features may be provided in the inactive face of the wafer to improve the adherence of the second layer to the wafer.

A further embodiment provides a method of marking a circuit provided in a semiconductor body, the semiconductor body having an active side where the circuit is provided and an inactive opposing side, the method comprising the steps of a) marking the inactive surface of the integrated circuit to provide a marked inactive surface, b) applying a protective layer of material to cover the marked inactive surface, the layer of material being substantially transparent to certain wavelengths to allow the marking to be visible through the protective layer and substantially opaque to other wavelengths of light to reduce the effects of external light on the circuit. Suitably, the light resistant covering is substantially opaque to infra red light and substantially transparent to blue light.

These and other features of the invention will be better understood with reference to the non-limiting exemplary embodiments which will be described below with reference to the following drawings.

DETAILED DESCRIPTION

The present application arises from the realization that certain integrated circuits are sensitive to light. In particular, it has been identified that certain wavelengths of light (particularly in the infra red spectrum) can pass through the inactive silicon of an integrated circuit. The present application seeks to protect an integrated circuit from the passage of light that may have a detrimental effect on the effective operation of the circuit and is directed at protecting chip scale packages (CSPs) and in particular wafer level CSPs (WLCSPs).

Figure 1:
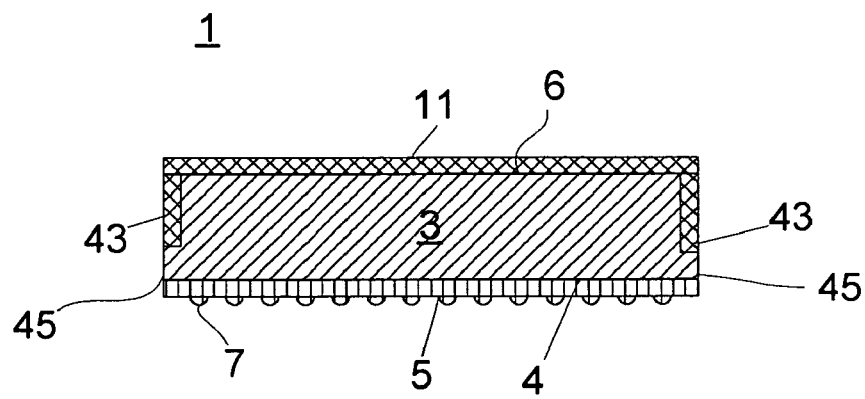
FIG. 1 is an exemplary WLCSP package in accordance with the teaching of the present application.

As shown in FIG. 1, a WLCSP 1 is provided having a silicon body 3 with an active face 4 and an opposing inactive face 6. A connection structure 5 with bumped connections 7 is provided on the active face to facilitate placement of the integrated circuit onto to a circuit board. The bumped connection structure is provided at wafer level (i.e. before integrated circuits are singulated from the wafer). In use, the bumped connections will connect the integrated circuit to the underlying circuit board. Methods for providing bumped connection structures are well known in the art.

A layer of light resistant material 11 covers the inactive face 6 of the WLCSP. The light resistant material is suitably selected to prevent unwanted light penetrating the inactive face to the underlying circuitry of the package.

Additionally, the sides of the package are at least partially coated with a layer of light resistant material 43. This light resistant side coating prevents unwanted light penetrating through the sides to the internal circuitry of the package. The combination of the inactive face and side coatings co-operate to reduce the amount of external light penetrating to the internal circuitry of the integrated circuit.

The devices are exposed on the sides in areas 45 immediately adjacent to the edge of the active face. Nonetheless, the partial side coating prevents significant light penetrating through the sides to the internal circuitry of the package. For reasons, which will become apparent from the manufacturing process described below, the side coating is provided in place of semiconductor material that has been removed (shown more clearly in FIG. 2). In effect, the semiconductor material is stepped at the edge with the light resistant material 43 filling the step. As a result, the side coating 43 is effectively flush with the exposed side areas 45 immediately adjacent to the active face. Additionally, the depth of the step ½(a−b) and thus the side coating may be of sufficient thickness to actually extend over part of the active silicon area 12 in which the internal circuitry of the chip is provided. In this regard, it will be appreciated that the depth (d) of the side coating does not extend to the active part of the silicon. The combination of the inactive face and partial side coating adjacent to the inactive face prevents a significant amount of light penetrating to the internal circuitry of the integrated circuit.

Figure 3:
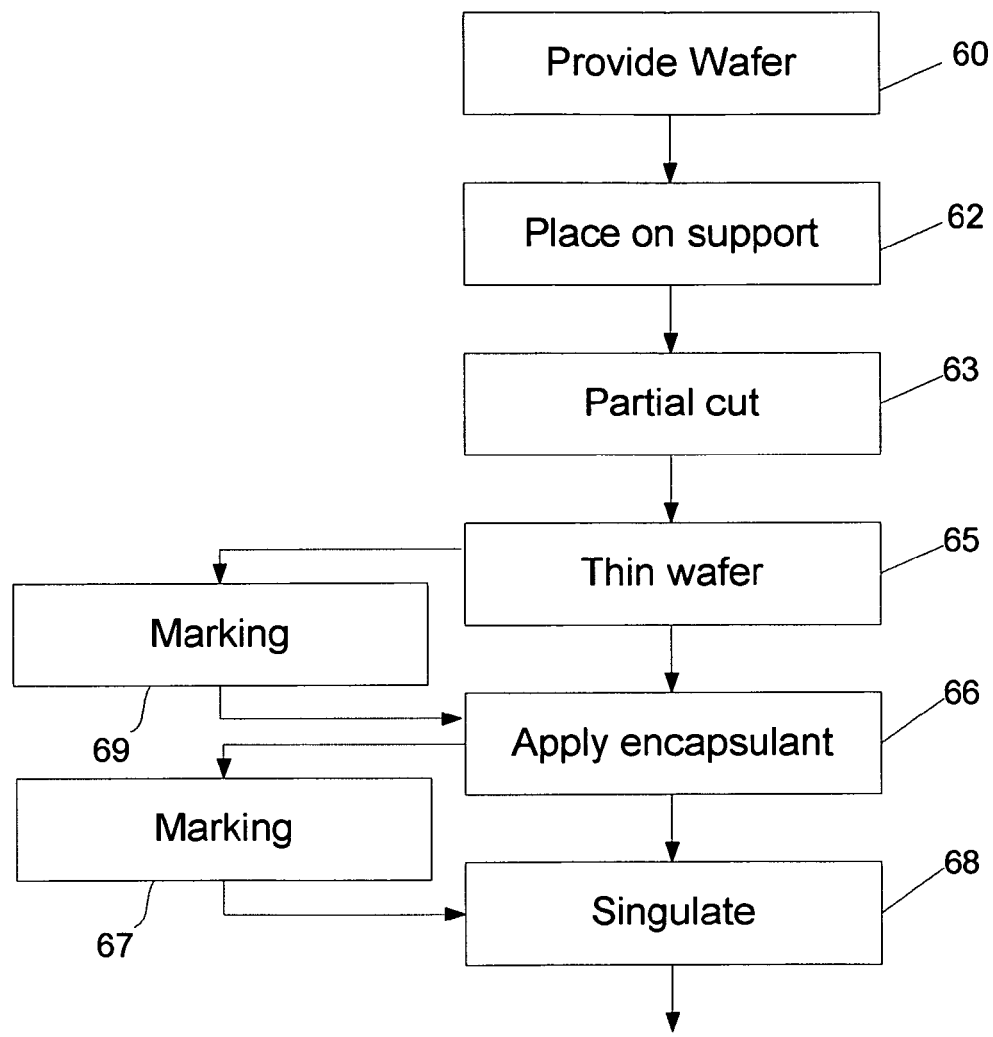
FIG. 3 is a process flow for manufacturing the WLCSP package of FIGS. 1 and 2.
Figure 4:
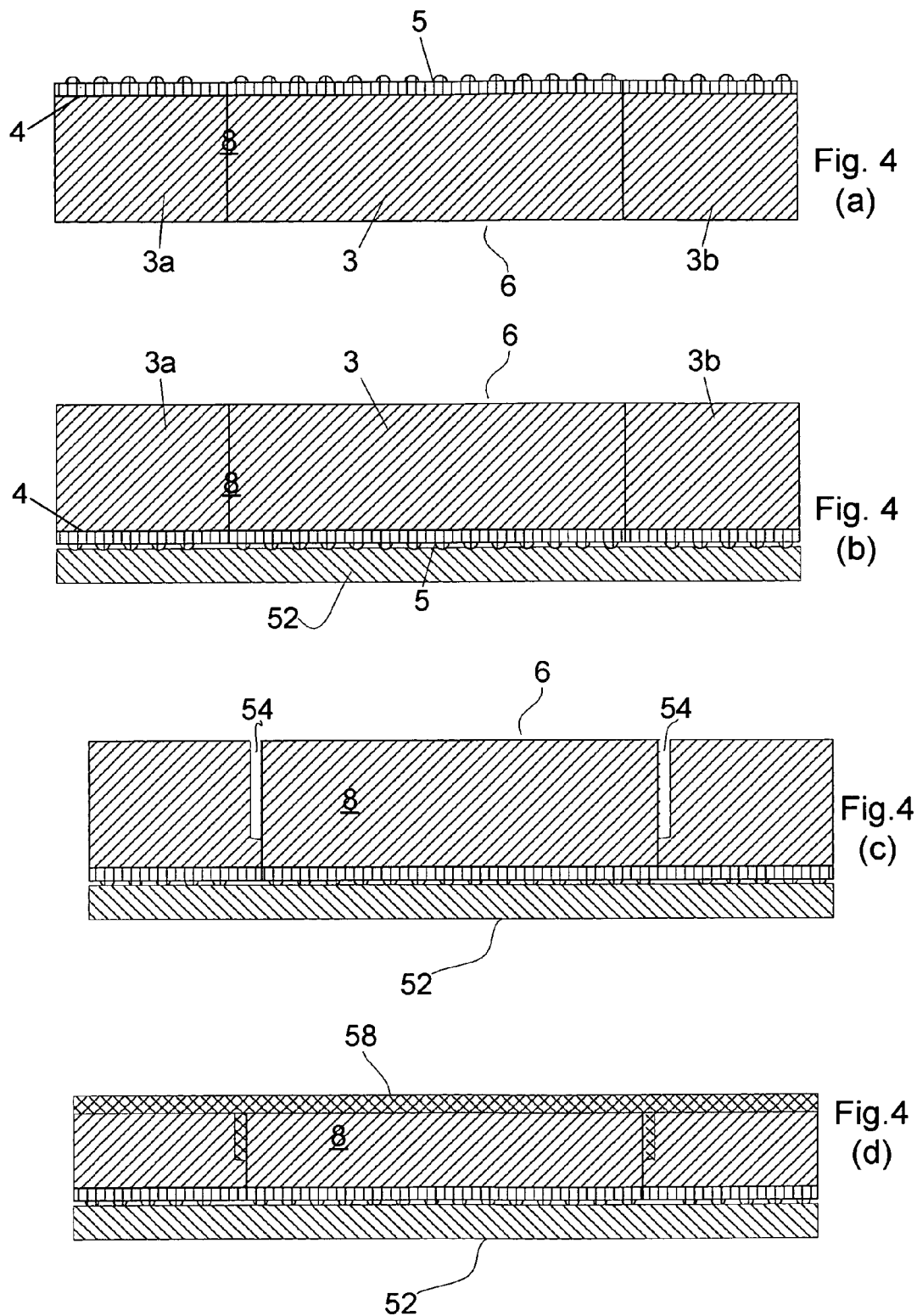
FIG. 4 illustrates the steps of the process flow of FIG. 3.

A method of construction for the device of FIG. 1, will now be described with reference to the process flow of FIG. 3 and the structures of FIG. 4, in which a first step 60 provides a wafer 8 comprising a plurality of individual integrated circuits 3, 3a, 3b. The active side of the wafer may be pre-provided with a connection structure 5, for example a bumped connection structure, using techniques well known in the art. Alternatively, the connection (bumped) structure may be provided as a final step in the fabrication process prior to singulation. An advantage of providing the bumped structure as a final step before singulation is that the connection structure will not be damaged during the encapsulation process described below. The inactive side 6 may have been pre-subjected to a thinning process, e.g. chemical polishing or backgrinding. Alternatively, the wafer may be thinned as a step in the process described below, for example after the partial cutting step (described below).

Figure 2:
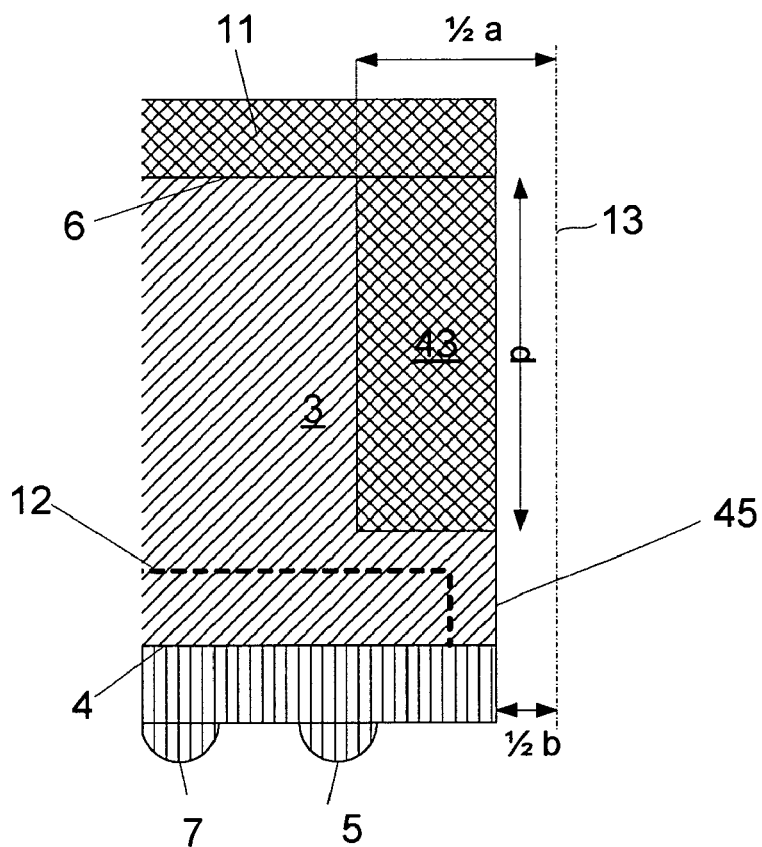
FIG. 2 is a blown up section of the right hand side of FIG. 1 in which the extent of the active silicon is identified.

The wafer may be pre-provided on a suitable support structure 52 (active side down) for handling, e.g. a support film or foil. Alternatively, such a support medium is provided as a step 62 in the process. In the event that the wafer is pre-provided with a support medium on the inactive face, a further step of removing this support medium may be required. A subsequent step 63 in the process provides a first series of grooves\partial cuts 54 in the inactive face 6 of the wafer. The depth of the partial cuts d is selected to subsequently provide a depth for adequate covering of the sides with light resistant material but not damage the active part of the silicon as will become apparent from the description which follows. The partial cuts are made along the singulation boundaries between the individual integrated circuits and equate to lines 13 along which the individual circuits would conventionally be singulated. As the partial cuts do not extend through to the active side of the wafer, the individual circuits are not singulated as a result of the partial cut. Moreover, as the partial cuts may not necessarily extend to the depth of the internal circuitry 12, the width of the cut a may be significantly greater than the width of a cut b used for singulation purposes as illustrated in FIG. 2. An advantage of this stepped cut is that a partial side covering with a light resistant material may be provided without increasing the required spacing between adjacent circuits on a wafer or the required device footprint.

With the support medium in place, the wafer may be thinned 65 (if not previously so) by removing material from the inactive side of the wafer. The removal of material may be by any conventional thinning process in the art including backgrinding or chemical polishing. In a variation of this process, the partial grooves are filled with a light resistant material (described below) before the thinning process. An advantage of conducting the partial cuts and filling before thinning is that the effects of chipping at the edges during the partial cutting process may be reduced. However, this is dependent on the manufacturing processes selected and it may be more advantageous to thin before providing the partial cuts As a result of the thinning process (if not pre-performed) the partial grooves 54 are effectively reduced in depth as the inactive surface has been lowered.

Figure 6:
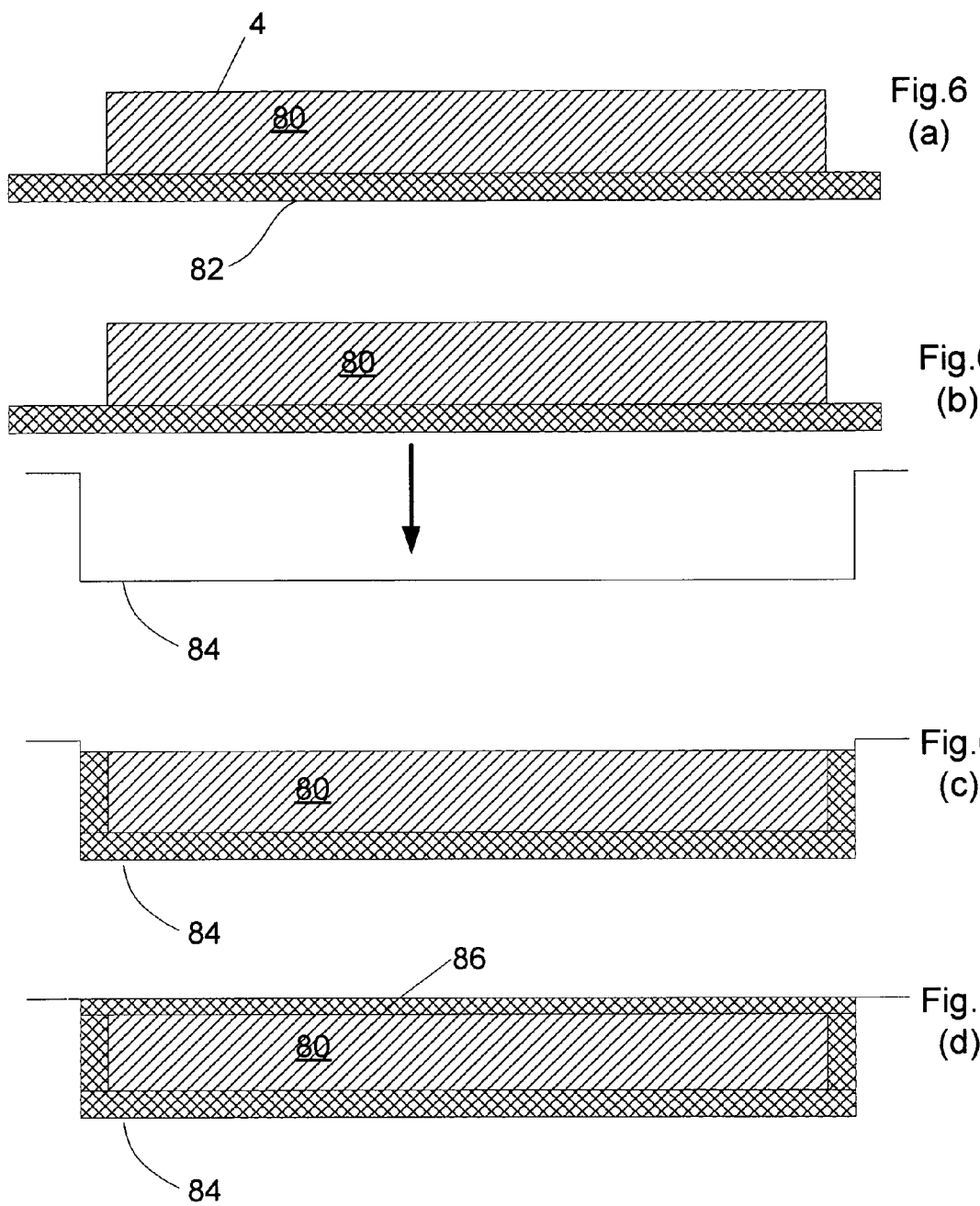
FIG. 6 illustrates some alternative steps in the process of FIG. 3.

In a subsequent step, a layer of light resistant material 58 is applied 66 to the inactive surface and to the grooves partially defining the sides of the individual circuits. This layer may be provided using a suitable deposition process and light resistant material, e.g. an encapsulant. A number of exemplary methods are discussed below with reference to FIG. 6 to 8.

The layer of encapsulant 58 provides a light resistant barrier on the inactive faces of the individual integrated circuits on the wafer. The layer of encapsulant on the inactive face provides a surface for marking, which may be provided as an optional step 67. This marking may be provided by any suitable means including for example screen printing, a chemical etch or a laser etch.

A singulation step 68 singulates the individual circuits of the wafer to provide individual WLCSPs having a structure as described previously with reference to FIGS. 1 & 2. The singulation process is selected to leave a layer of the light resistant material on the sides of the individual circuits. This may be achieved using a cutting technique that provides a narrower cut than used initially to form the grooves\partial cuts. The singulation process 68 may cut through the wafer from the inactive face to the active face or alternatively the wafer may be flipped and cut from the active face to the inactive face. Depending on the singulation process, damage to the chip may be reduced by selection of one direction of cutting over the other.

One variation in the process provides for marking 69 of the wafer on the inactive face of the wafer in advance of applying the light resistant material. This marking may be defined, for example, by a laser marking, chemical etching or screen printing process. Where markings are provided directly onto the active face of the wafer, the light resistant material is selected to allow the markings to be visible through the light resistant material. At the same time, the light resistant material is carefully selected to prevent undesired wavelengths of light penetrating the light resistant material to the internal circuitry (discussed in greater detail below).

Figure 5:
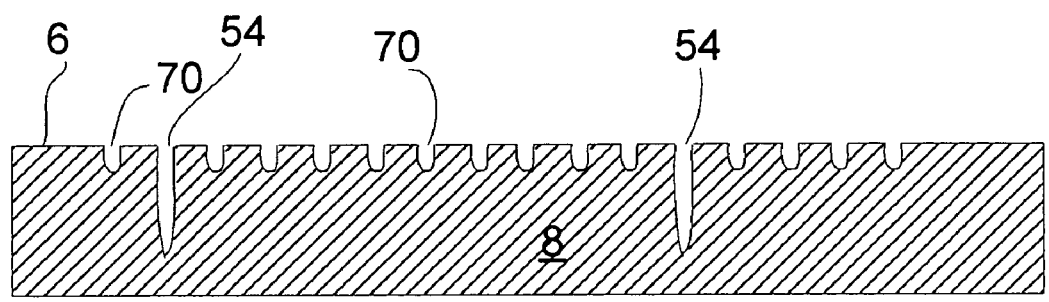
FIG. 5 is a feature that may be employed advantageously in the manufacturing processes described in this application.

With all of the devices described above, the adhesion of the light resistant material is of significance since the light resistant material typically does not encapsulate the entire device. As a result, the light resistant material may be more prone to chipping or peeling in subsequent handling steps during shipping, end-assembly etc. than a fully encapsulated part. Accordingly, it is advantageous to improve the adherence of the light resistant material to the inactive side of the device. Accordingly, an optional feature \ step in the process may be provided. In particular, the step involves providing adherence features 70, as shown in FIG. 5 in the inactive face 6 of the wafer 8 prior to the application of the light resistant material to improve adhesion. The adherence features may be grooves or pits formed by any suitable process, including using an etching process to define a pattern of grooves or pits or similarly using a second series of partial cuts in the inactive side. These secondary partial cuts 70 are suitably shallower than the previously described partial cuts 54. The secondary partial cuts provide greater adhesion for the light resistant material onto the backside of the wafer. It will be appreciated that the pattern of adherence features may be selected to maximize the adhesion.

The process of filling the grooves and covering the inactive face with the light resistant material may be performed in the same step. Some exemplary methods for filling the grooves and covering the inactive face will now be described.

In one method, a previously thinned and partial cut wafer 80 is inverted and placed inactive face down (active face 4 up) on a curable film 82 of light resistant material. Optionally, the film may be pre-printed or marked with device marking so as to avoid the requirement for a subsequent separate marking process. For simplicity, the connection structures (if present) and partial cuts are not shown in the representation. The wafer and light resistant film are placed within a mould 84 which may for example be a recessed plate. Alternatively, the film 82 may be pre-placed within the mould 84 and the wafer inserted. The mould is suitably dimensioned to accommodate the wafer and film. The base of the mould may be provided with openings connected to a pressure source. The pressure source may be used to create a reduced pressure (e.g. a vacuum) to draw the foil and wafer into the mould and\or an increased pressure for subsequently blowing the wafer and film combination out of the mould. Similarly, mechanical eject pins may be employed to eject the wafer and film combination from the mould. Once the wafer and film are in the mould, a source of heat is introduced to the base of the mould (e.g.) electrical elements housed within the base to assist the curing of the film. Advantageously, the heat causes the film to deform and fill the partial cuts.

An optional step may be provided comprising depositing a layer 86 of light resistant material on the active face of the wafer. In a first variation, the depth of the layer of light resistant material on the active face is carefully selected to leave the connections of the connection structure exposed. The light resistant material may be applied, for example as a viscous encapsulant using a dispensing nozzle. In a second variation, where the light resistant material is suitable, a mould may not be necessary and instead the active side of the wafer may be placed directly upon the light resistant material (e.g. a film) and placed upon a heat source such as a heated plate to allow the film to cure and adhere to the active face of the wafer. In this second variation, the connection structure would have been pre-provided to the stage of metal connection pads on the active surface. Once the film has been cured, a backgrinding step or etching step may be used to expose the previously provided metal connection pads. Where a backgrinding step is employed, the film may be supplied with suitable reservoirs provided in the surface, which co-operate to receive the metal connection pads. Suitably, the reservoirs are sized to provide some space around the metal connection pads to facilitate placement of the wafer on the foil. During the curing process the film softens and fills the space between the metal connection pads and the film. With the etching step a standardized stencil could be used wafers with standard device package formats. Solder bumps may then be applied through the openings in the foil layer effectively using the foil layer as a stencil. The devices may be singulated as described before.

Figure 7:
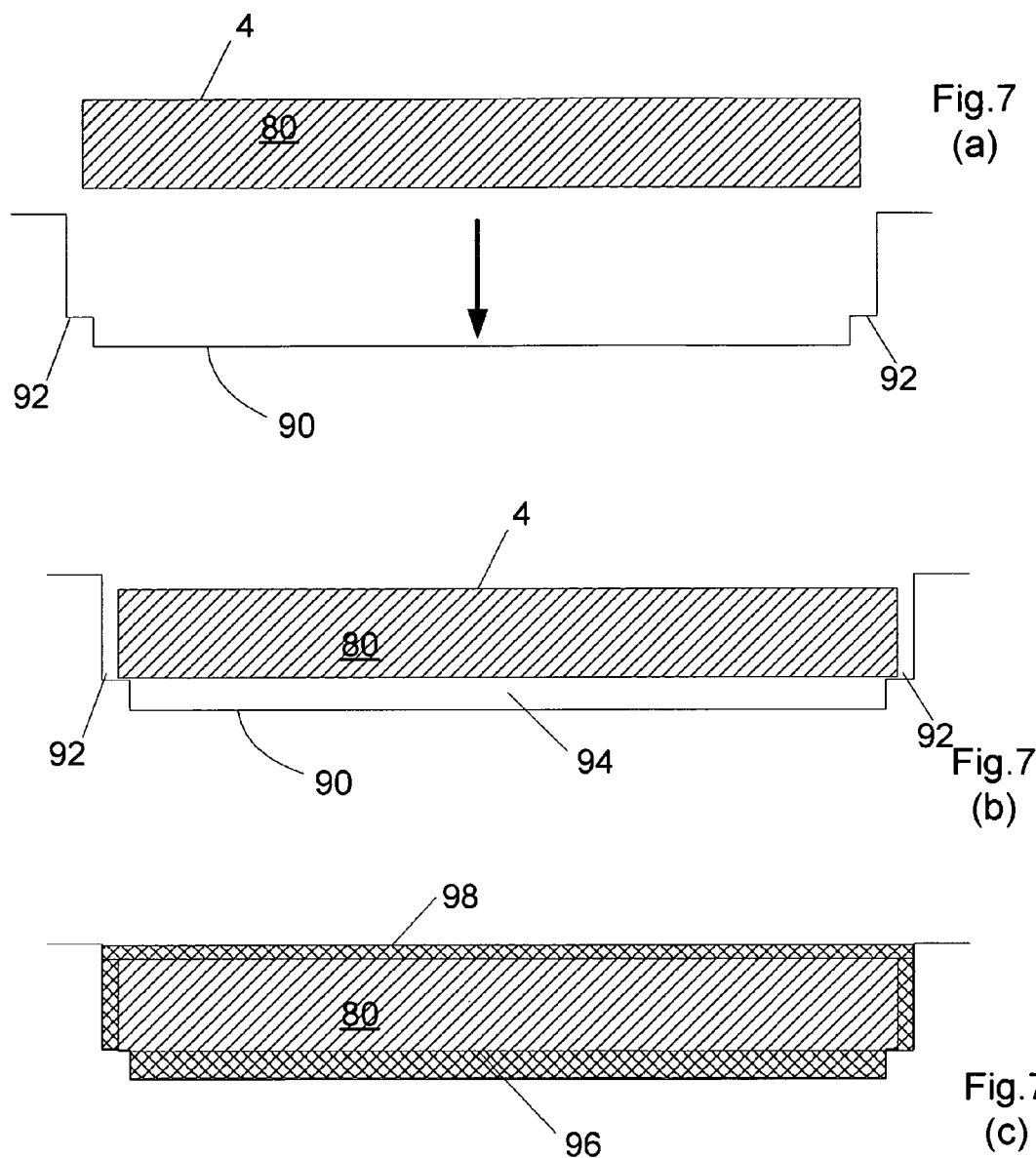
FIG. 7 illustrates some alternative steps in the process of FIG. 3.

In another method, shown illustratively in FIG. 7, a previously thinned and partial cut wafer 80 is inverted and placed inactive face down within a mould cavity. As with FIG. 6, the partial cuts and connection structures are not shown for simplicity of representation. The mould cavity is provided with a support structure 92 (e.g. a lip) around its inner wall that is dimensioned to support the edges of the wafer and leave a recessed space 94 below the majority of the wafer. A selection of different mould cavities may be used depending on the wafer diameter and thickness. Once the wafer is in the mould. A liquid light resistant material 96 (e.g. an encapsulant) is introduced to fill the mould space, e.g. through a plurality of dispensing inlets in the mould (not shown). A heat source may be provided to assist in the curing\drying process. Optionally, the quantity of liquid light resistant material may be selected so that it effectively overflows the wafer and provides a layer of light resistant material 98 at least partially covering the active surface of the wafer. Preferably, the connections are not covered by this layer. In either the process of FIG. 6 or FIG. 7, a foil layer may be applied to the active side of the wafer during the process to facilitate subsequent transport and handling of the wafer.

Figure 8:
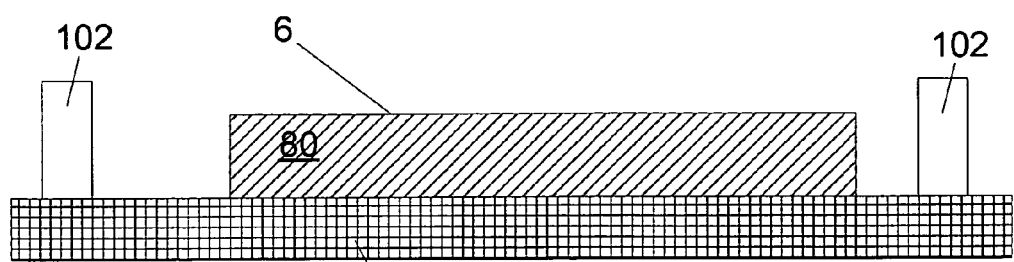
FIG. 8 illustrates some further alternative steps in the process of FIG. 3.
Figure 8:
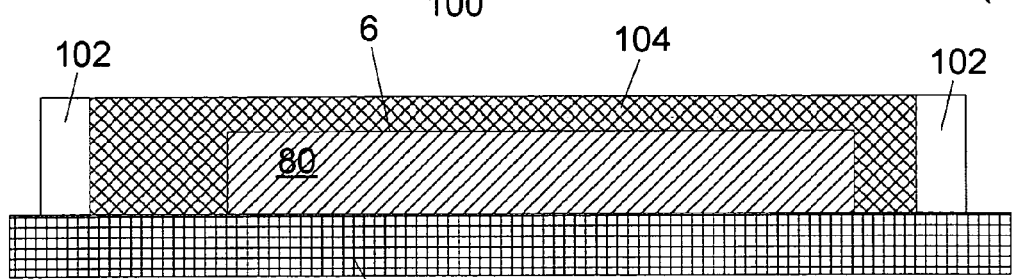

In a further method, shown in FIG. 8, the wafer is placed active face down (inactive face 6 up) on a peelable support medium 100 (thick film/foil as might conventionally be employed to support wafers during back grinding). A dam 102 is placed around the wafer. A light resistant material in liquid form is then introduced to the resulting reservoir formed by the dam 102 and peelable support medium 100 causing the inactive surface 6 of the wafer 80 to be covered and the partial cuts (not shown) filled. Once the light resistant material has dried (cured), the dam may be removed and the peelable film peeled away from the wafer. Alternatively, a curable film may be used in place of the peelable film and left on the wafer after the dam has been removed. This film may then be etched to expose the connections of the connection structure on the active face of the wafer. Optionally, as referred to above, the light resistant material may be wavelength specific. Insofar as it is believed that it is primarily light close to the IR spectrum that causes problems in the underlying circuitry of the integrated circuit (e.g. unwanted leakage currents). Accordingly, the light resistant material may be selected to prevent the penetration of unwanted frequencies of light (e.g. infra-red) but allow the penetration of desired frequencies of light (e.g. blue light). Allowing certain frequencies of light to penetrate the light resistant material allows markings (for example screen printed or laser etched) on the inactive surface of the devices to be readable. Experimental data has shown that blue and to a lesser extent green light does not lead to significant unwanted effects in integrated circuits. Accordingly, a light resistant material, which filters wavelengths above 640 nm and prevents them from passing through to the underlying silicon is desirable, with best results achieved if wavelengths above 580 nm are filtered.

Experiments have shown that WLCSPs without any light resistant coatings are typically closer to datasheet performance limits than their equivalent packaged parts when exposed to light at certain wavelengths. A key advantage of the processes described herein is that whereas the performance of WLCSPs with a light resistant coating on the active side are close to datasheet limits, with WLCSPs having an light resistant coating on the inactive side and on the sides are well within datasheet limits.

The connection structure provided on the wafer herein may be complete or partially complete depending on the connection structure and the particular method. For example with solder ball connections, the solder balls may be applied after the encapsulation process but before singulation.

The coatings on the top and partial sides also serve to protect the integrated circuits mechanically, both as individual devices and the wafer as a whole. As wafer diameters increase, the minimum required wafer thickness also increases to avoid handling damage, since the larger the wafer diameter the more the wafer will bend and bow. For example, bumping subcontractors generally specify a minimum wafer thickness. Currently, a significant number of semiconductor companies ship their wafers to a bumping subcontractor to provide the bumped connection structures described above. The above described methods, including for example using partial cuts to provide side coverage and the use of adherence features on the inactive side may be advantageous in minimizing the minimum required wafer thickness for wafer handling purposes.

The processes described herein are merely examples and it will be appreciated that a variety of processes may be employed in the manufacturing process. For example, the application of the light resistant material may be, for example by means of screen printing, sputtering, spraying or spinning.

Although, the above application has been described with reference to exemplary embodiments, it will be appreciated that these are merely examples and the application is not to be construed as being limited to these examples. Instead, the application is construed in accordance with the spirit and the scope of the claims which follow.

The words comprises/comprising when used in this specification are to specify the presence of stated features, integers, steps or components but does not preclude the presence or addition of one or more other features, integers, steps, components or groups thereof.

The invention claimed is:

1. A Wafer Level Chip Scale Package (WLCSP) comprising:
   a substrate comprising:
      an active face;
      a non-active face opposing the active face;
      an active silicon area between the active face and the non-active face, wherein contacts to the active silicon area are provided on the active face; and
      a plurality of sides between the active face and the non-active face, wherein at least one side comprises a step, wherein the step extends along a vertical axis from the non-active face towards the active face to a depth that does not reach a level of the active silicon area, and wherein at least a portion of the step extends over the active silicon area along a horizontal axis;

a side coating of an encapsulant provided in the step, wherein an outer wall of the side coating is defined by a singulation cut that separates the active silicon area from a wafer; and a layer of the encapsulant covering the non-active face, wherein the layer and the side coating protect at least a portion of the active silicon area.

2. The WLCSP package according to claim 1, wherein the layer is light resistant.

3. The WLCSP package according to claim 2, wherein the side coating is light resistant.

4. The WLCSP according to claim 3, wherein the layer and the side coating are substantially opaque.

5. The WLCSP according to claim 3, further comprising adherence features defined on the non-active face of the substrate for improving the adherence of the layer to the non-active face.

6. The WLCSP according to claim 2, wherein the light resistant layer allows certain wavelengths of light to pass through.

7. The WLCSP according to claim 6, wherein a device marking is provided on the non-active face under the light resistant layer.

8. The WLCSP according to claim 6, wherein the light resistant layer is substantially opaque to infra red light.

9. The WLCSP according to claim 6, wherein the light resistant layer is substantially transparent to blue light.

10. The WLCSP according to claim 1, wherein the layer and the side coating comprise a continuous layer of material.

11. The WLCSP according to claim 1, wherein a device marking is provided on the layer.

12. The WLCSP according to claim 1, wherein the thickness of the side coating is greater than the thickness of the at least one circuit.

13. The WLCSP according to claim 1, further comprising a connector arrangement provided on the active face for making external connections to the contacts on the active face.

14. The WLCSP according to claim 1, further comprising adherence features defined on the non-active face of the substrate for improving the adherence of the layer to the non-active face.

15. The WLCSP package according to claim 1, wherein the at least one side comprises four sides between the active face and the non-active face, wherein each side comprises a step, wherein each step extends along a vertical axis from the non-active face towards the active face to a depth that does not reach a level of the active silicon area, and wherein at least a portion of each step extends over the active silicon area along a horizontal axis.

16. The WLCSP according to claim 1, further comprising a plurality of grooves or pits defined on the non-active face of the substrate, wherein the grooves or pits are shallower than the step, wherein the grooves or pits are filled by the layer of the encapsulant covering the non-active face and improve the adherence of the layer to the non-active face.

17. A Wafer Level Chip Scale Package (WLCSP) comprising:
a substrate comprising:
an active face;
a non-active face opposing the active face;
an active silicon area between the active face and the non-active face, wherein contacts to the active silicon area are provided on the active face; and
a plurality of sides between the active face and the non-active face, wherein at least one side comprises a step,
wherein the step extends along a vertical axis from the non-active face towards the active face to a depth that does not reach a level of the active silicon area, and wherein at least a portion of the step extends over the active silicon area along a horizontal axis;

a side coating of an encapsulant provided in the step, wherein an outer wall of the side coating is defined by a singulation cut that separates the active silicon area from a wafer; and a light-resistant layer of the encapsulant covering the non-active face,
wherein the light-resistant layer and the side coating protect at least a portion of the active silicon area.

18. The WLCSP package according to claim 17, wherein the at least one side comprises four sides between the active face and the non-active face, wherein each side comprises a step, wherein each step extends along a vertical axis from the non-active face towards the active face to a depth that does not reach a level of the active silicon area, and wherein at least a portion of each step extends over the active silicon area along a horizontal axis.

19. The WLCSP according to claim 17, further comprising a plurality of grooves or pits defined on the non-active face of the substrate, wherein the grooves or pits are shallower than the step, wherein the grooves or pits are filled by the layer of the encapsulant covering the non-active face and improve the adherence of the layer to the non-active face.

20. A Wafer Level Chip Scale Package (WLCSP) comprising:
a substrate comprising:
an active face;
a non-active face opposing the active face;
an active silicon area between the active face and the non-active face, wherein contacts to the active silicon area are provided on the active face; and
a plurality of sides between the active face and the non-active face, wherein at least one side comprises a step, wherein the step extends along a vertical axis from the non-active face towards the active face to a depth that does not reach a level of the active silicon area, and wherein at least a portion of the step extends over the active silicon area along a horizontal axis;

a light-resistant side coating of an encapsulant provided in the step, wherein an outer wall of the side coating is defined by a singulation cut that separates the active silicon area from a wafer; and a layer of the encapsulant covering the non-active face,
wherein the layer and the light-resistant side coating protect at least a portion of the active silicon area.

21. The WLCSP package according to claim 20, wherein the at least one side comprises four sides between the active face and the non-active face, wherein each side comprises a step, wherein each step extends along a vertical axis from the non-active face towards the active face to a depth that does not reach a level of the active silicon area, and wherein at least a portion of each step extends over the active silicon area along a horizontal axis.

22. The WLCSP according to claim 20, further comprising a plurality of grooves or pits defined on the non-active face of the substrate, wherein the grooves or pits are shallower than the step, wherein the grooves or pits are filled by the layer of the encapsulant covering the non-active face and improve the adherence of the layer to the non-active face.

23. A Wafer Level Chip Scale Package (WLCSP) comprising:
- a substrate comprising:
  - an active face;
  - a non-active face opposing the active face;
  - an active silicon area between the active face and the non-active face, wherein contacts to the active silicon area are provided on the active face; and
  - a plurality of sides between the active face and the non-active face, wherein at least one side comprises a step, wherein the step extends along a vertical axis from the non-active face towards the active face to a depth that does not reach a level of the active silicon area, and wherein at least a portion of the step extends over the active silicon area along a horizontal axis;
- a side coating of an encapsulant provided in the step, wherein an outer wall of the side coating is defined by a singulation cut that separates the active silicon area from a wafer; and
- a layer of the encapsulant covering the non-active face, wherein layer is continuous and contiguous with the side coating, and wherein the layer and the side coating protect at least a portion of the active silicon area.

24. The WLCSP package according to claim 23, wherein the at least one side comprises four sides between the active face and the non-active face, wherein each side comprises a step, wherein each step extends along a vertical axis from the non-active face towards the active face to a depth that does not reach a level of the active silicon area, and wherein at least a portion of each step extends over the active silicon area along a horizontal axis.

25. The WLCSP according to claim 23, further comprising a plurality of grooves or pits defined on the non-active face of the substrate, wherein the grooves or pits are shallower than the step, wherein the grooves or pits are filled by the layer of the encapsulant covering the non-active face and improve the adherence of the layer to the non-active face.

* * * * *